United States Patent
Chen et al.

[11] Patent Number: 6,160,311
[45] Date of Patent: Dec. 12, 2000

[54] ENHANCED HEAT DISSIPATING CHIP SCALE PACKAGE METHOD AND DEVICES

[75] Inventors: Tsung-Chieh Chen, Taipei; Yi-Liang Peng, Hsinchu, both of Taiwan

[73] Assignee: First International Computer Inc., Taipei, Taiwan

[21] Appl. No.: 09/330,995

[22] Filed: Jun. 14, 1999

[51] Int. Cl.[7] .............. H01L 23/34; H05K 5/03; H05K 5/04; H05K 7/20
[52] U.S. Cl. ............ 257/706; 257/712; 257/709; 257/738; 257/788; 257/787; 257/687; 257/693; 257/698; 361/758; 361/714; 361/715
[58] Field of Search ............... 257/706, 712, 257/713, 717, 720, 796, 693, 723, 686, 685, 737, 738, 734, 778, 788, 675, 687, 698, 709, 708; 361/758, 704, 714, 715

[56] References Cited

U.S. PATENT DOCUMENTS

| | | | |
|---|---|---|---|
| 5,409,865 | 4/1995 | Karnezos | 29/827 |
| 5,724,230 | 3/1998 | Poetzinger | 361/758 |
| 5,767,579 | 6/1998 | Kanazawa et al. | 257/717 |
| 5,825,088 | 10/1998 | Bartlow | 257/712 |
| 5,990,552 | 11/1999 | Xie et al. | 257/718 |
| 5,998,241 | 12/1999 | Niwa | 257/706 |

*Primary Examiner*—Alexander O. Williams
*Attorney, Agent, or Firm*—Dougherty & Troxell

[57] ABSTRACT

An enhanced heat dissipating Chip Scale Package (CSP) method and devices include preparing a heat dissipating base with a recess surrounded by a guarding wall. A chip with an integrated circuit (IC) layout is adhered the heat dissipating base in the recess. A substrate with a metallic circuit layer that is smaller size than the chip is then adhered to the chip. Then coupling the metallic circuit layer with the IC layout. A non-conductive resin is then filled in the recess within the guarding wall and covers the coupling portion. The resulting package device produced by means of BGA package process is small size and has enhanced heat dissipating property. The Package size/chip size ratio may be lower than 1.2 to meet the CSP requirements.

7 Claims, 6 Drawing Sheets

ENHANCED HEAT DISSIPATING CHIP SCALE PACKAGE METHOD AND DEVICES

BACKGROUND OF THE INVENTION

1. Field of the Invention

This invention relates to an enhanced heat dissipating chip scale package method and devices, and particularly to a chip scale package method and device that employs Ball Grid Array Package (BGA package) structure and process to get enhanced heat dissipating effect and small size package.

2. Description of the Prior Art

In the Semiconductor integrated circuit (IC) industry, how to make IC package thin and small size, and get better heat dissipating efficiency in a simple and low cost production process is a heavily focused subject. Among the many known techniques, the chip Scale Package (CSP) technique is a popular method. It can attain the Package size/Chip size ratio below 1.2.

FIG. 1 illustrates a conventional BGA package member 1 which includes a substrate 2 with two metallic circuit layouts disposed respectively on an upper side and a lower side thereof (not shown in the figure). The two metallic circuit layouts are coupled with each other by means of a plurality of plugs (not shown in the figure) running through the substrate 2. The upper side of the substrate 2 adheres to a chip 4 by means of non-conductive resin 3. The lower side adheres to a plurality of solder balls 5. The chip 4 is coupled with the metallic circuit layouts on the upper side by means of gold wires 6. Then a filler 7 (such as EPOXY) is used to cover the top of the chip 4 and the coupling portion between the chip 4 and the substrate 2 to enhance the package reliability.

The BGA Package member 1 set forth above has the shortcomings of large package size and poor heat dissipating property resulting from the filler 7. As the gold wire 6 has to extend outward from the chip 4 to couple with the substrate 2, the substrate 2 should be larger than the chip 4. The Package size/chip size ratio usually is over 1.4 or even 1.6. It becomes a big design limitation.

At present, there is an Enhanced BGA (EBGA) package technique being developed. FIG. 2 illustrates an EBGA package member 10 which includes a chip 11, a Tape substrate 12 which has metallic circuits disposed at one side thereof, a plurality of solder balls 13 adhered to a lower side of the Tape substrate 12 and a metallic heat dissipating member 16. Between the solder balls 13 and the Tape substrate 12, there is a non-conductive solder ball mask 14 for preventing oversize solder balls from making a short circuit with the metallic circuits in the Tape substrate 12. The Tape substrate 12 and the chip 11 are adhered to the heat dissipating member 16 by means of Epoxy 18. The Tape substrate 12 has a center opening to contain the chip 11. The metallic circuits in the Tape substrate 12 are coupled with the chip 11 by means of gold wires 17. The active side of the chip 11 (i.e., where IC layouts are disposed), is molded with a filler 15 to cover the active side of the chip and the gold wire coupling portions. An annular dike ring 19 is disposed around the juncture of the gold wires 17 and the metallic circuits for preventing the filler 15 from overflowing.

Comparing with conventional BGA package, this EBGA package is thinner and has better heat dissipating property. The heat dissipating member 16 also provides support for the chip 11 and the relatively soft Tape substrate 12. However the gold wire 17 coupling is still formed from the chip 11 outward to the Tape substrate 12. The Package Size/Chip size ratio usually is larger than 1.4. It still does not totally meet CSP requirement.

SUMMARY OF THE INVENTION

In view of the aforesaid disadvantages, it is therefore an object of this invention to provide an enhanced heat dissipating chip scale package method and device that has a high heat dissipating capability and small size to meet the CSP requirements.

It is another object of this invention to provide an enhanced heat dissipating chip scale package that has a heat dissipating base with a special guarding wall for holding the chip therein so that the filler won't overflow during the molding process and the dike ring may be dispensed with.

The method according to this invention includes the following steps:

a. Element Preparing. At least one chip which has IC layouts on an active side and a heat dissipating base which has a guarding wall for holding the chip therein are formed. The active side has a plurality of Al (aluminum) pads disposed around the chip borders.

b. Die Bonding. Using adhesive to adhere the chip to the heat dissipating base within the guard wall;

c. Substrate Attaching. Adhering a substrate to the chip at a side remote from the heat dissipating member. The substrate is smaller size than the chip and the Al pads are exposed outside the substrate. The substrate is formed with at least one metallic circuit layer.

d. Wire Bonding. Coupling the Al pads with the metallic circuit layer by means of gold wire bonding to establish electrical contact therebetween. The gold wire is extended from the chip inward to the substrate. Hence the package size is small and may meet CSP requirements.

e. Molding. Filling a non-conductive resin filler in the guarding wall to cover at least the outer edge of the chip and the coupling portion; and f. Ball Attaching. Planting a plurality of metallic balls on a side of the substrate remote from the chip at a location not covered by the filler but making contact with the metallic circuit layer of the substrate remote.

According to another aspect of this invention, a plurality heat dissipating bases may be formed in a frame. Each heat dissipating base may contain a chip by the process steps from "a." through "f." set forth above so that multiple number of packages may be made. Then the frame is cut to individual IC device. It is a batch production method which may increase production efficiency at lower cost.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENT

The enhanced heat dissipating chip scale package method according to this invention mainly uses a heat dissipating base to adhere to a chip and a substrate within a guarding ball formed in the base. The substrate and the package after electrical coupling has a smaller size than the chip. A filler is filled within the guarding wall without overflow, then metallic balls are planted on the substrate without being covered by the filler. As the chip is adhered to the heat dissipating base, the package has enhanced heat dissipating efficiency but at a size no bigger than the chip. The package size/chip size ratio may be lower than 1.2 and thus meet CSP requirements.

Referring to FIGS. 3A through 3G, the method of this invention includes the following steps:

a. Element Preparing

Figure 1:
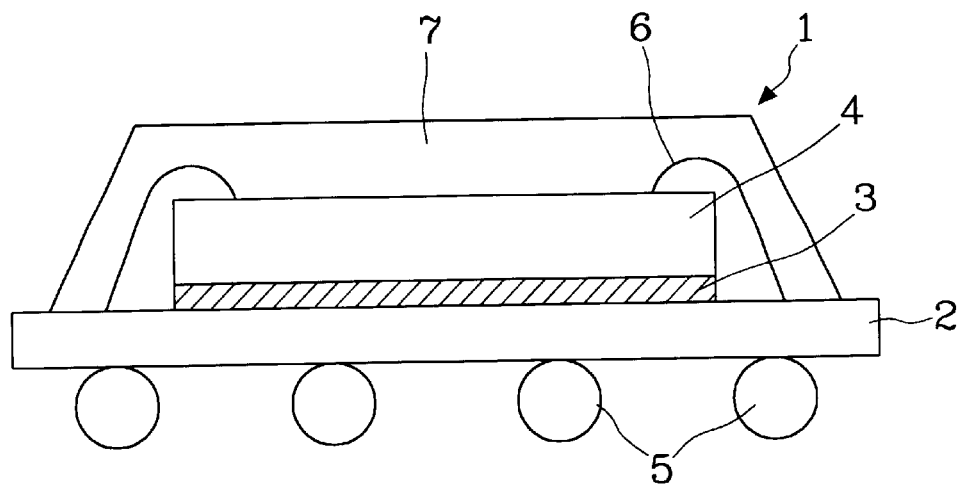
FIG. 1 is a sectional view of a conventional BGA package.
Figure 2:
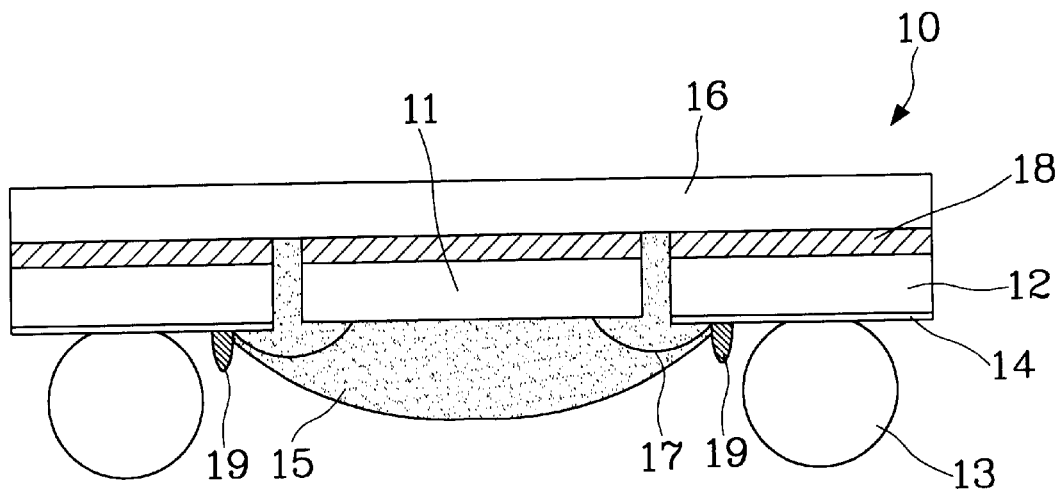
FIG. 2 is a sectional view of a conventional Enhanced BGA package.
Figure 3:
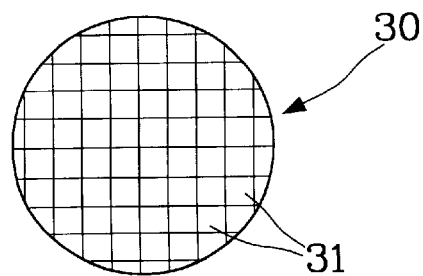
FIG. 3A~3G show process steps for an embodiment of this invention.
Figure 3:
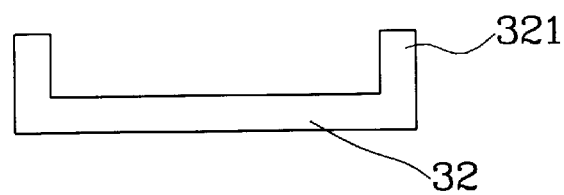
Figure 3:
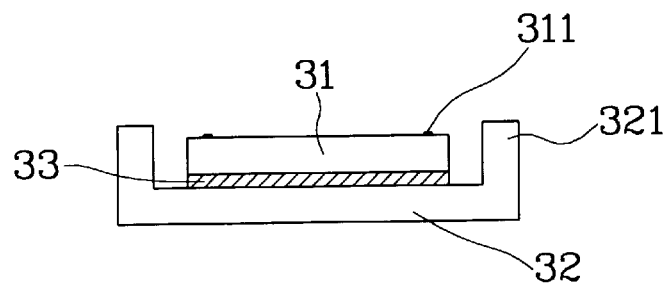
Figure 3:
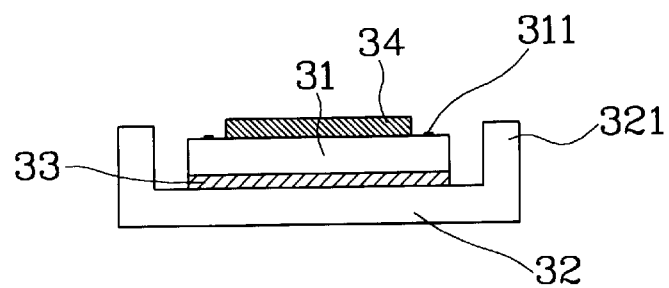
Figure 3:
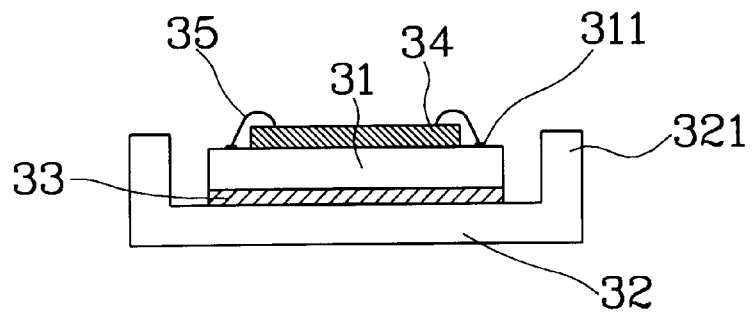
Figure 3:
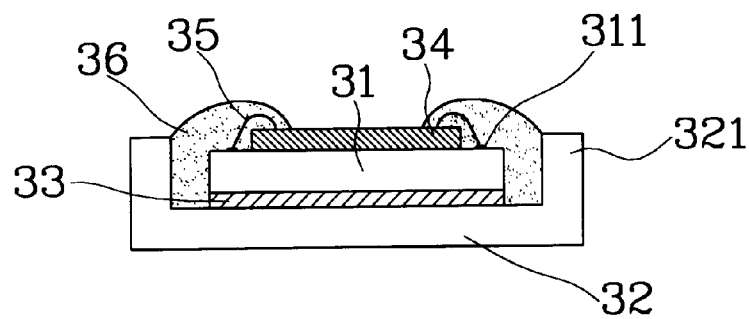
Figure 3:
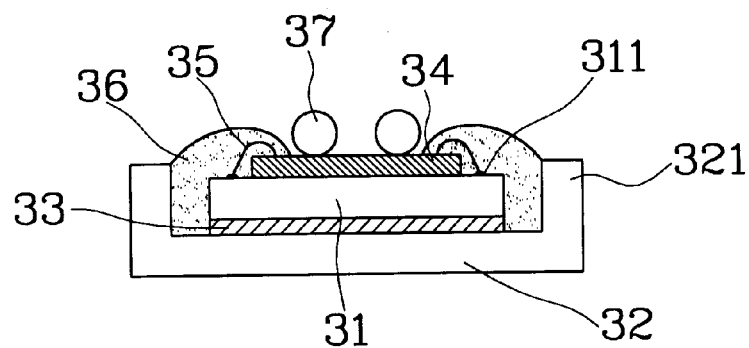
Figure 4:
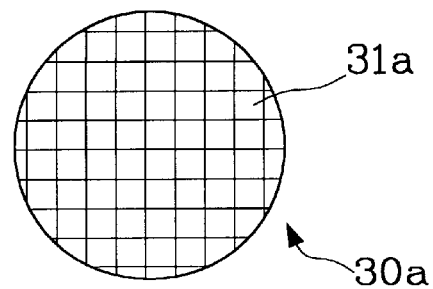
FIG. 4A~4H show process steps for another embodiment of this invention.
Figure 4:
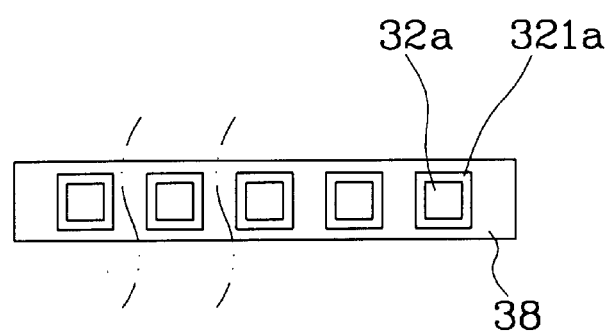
Figure 4:
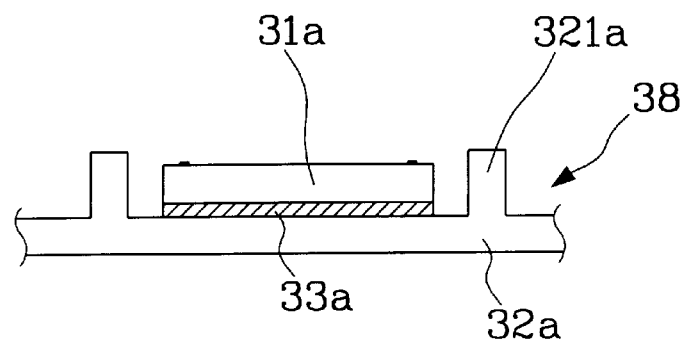
Figure 4:
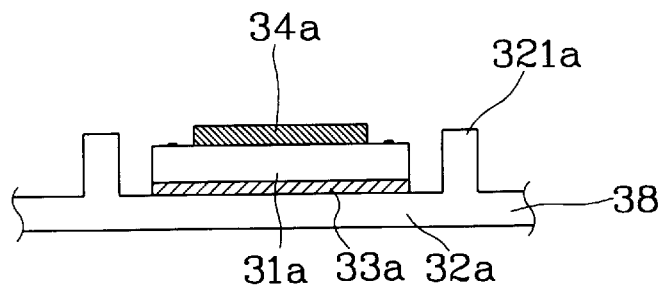
Figure 4:
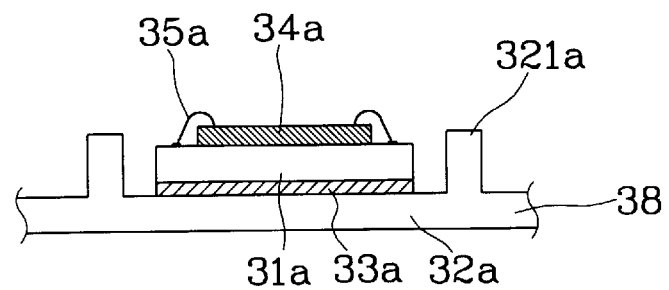
Figure 4:
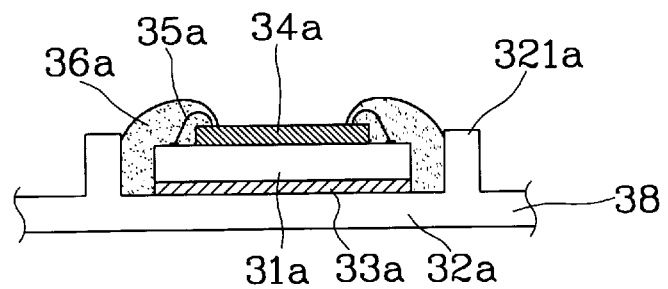
Figure 4:
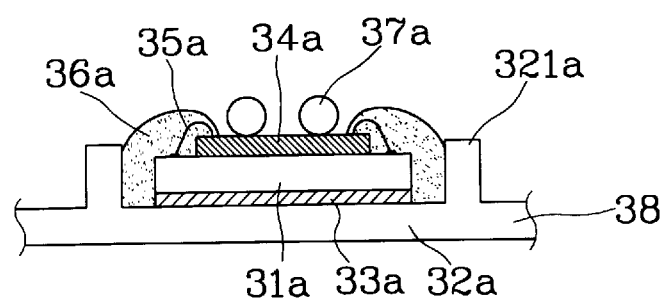
Figure 4:
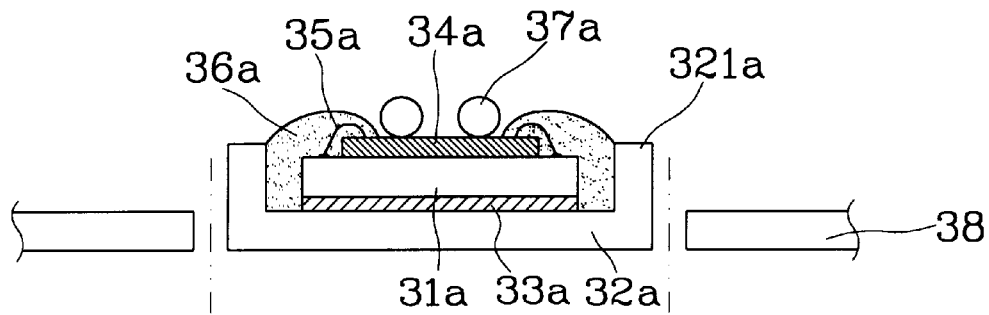

As shown in FIG. 3A, producing a wafer 30 including a plurality of IC chips 31 by means of a semiconductor manufacturing process. Then cutting the wafer 30 to multiple number of chips 31. Each chip 31 has IC layout on one side and a plurality of Al pads 311 around the borders thereof (shown in FIG. 3C) for coupling the IC layout with external electrical contact.

Forming a heat dissipating base 32 (FIG. 3B) by means of injection molding process upon a conventional lead frame, or pressing or etching a metallic plate with a rectangular center recess (unmarked) and a surrounding guarding wall 321. The recess is slightly larger than the chip 31. The heat dissipating base 32 is preferably made of a good heat dissipating material such as non-conductive $Al_2O_3$, or conductive metals such as gold, copper, silver, aluminum, nickel, iron or other alloys desired.

b. Die Bonding

As shown in FIG. 3C, the chip 31 is adhered to the heat dissipating base 32 within the guarding wall 321 by means of adhesive 33, preferably Epoxy or Dual-Sided Adhesive Tapes. Because the chip 31 adheres to the heat dissipating base 32 directly, a good heat dissipating effect may be achieved to meet the Enhanced BGA package requirements.

c. Substrate Attaching

As shown in FIG. 3D, adhering a substrate 34 which has a metallic circuit layer to the chip 21 at a side remote from the heat dissipating base 32. The substrate 34 is smaller in size than the chip 31 and enables the Al pads 311 (which are located around the outer edge of the chip 31) to be exposed.

d. Wire Bonding

As shown in FIG. 3E, engaging one end of a gold wire 35 with the metallic circuit layer and another end thereof with the Al pad 311 to couple the substrate 34 with the chip 31. Since the gold wire 35 is extended from the chip 31 inward to the substrate 34, overall package size may be greatly reduced. The Package size/chip size ratio may be lower than 1.2 to meet CSP requirements.

e. Molding

As shown in FIG. 3F, filling a non-conductive resin filler 36 (preferably Epoxy) in a space formed between the guarding wall 321 and side edges of the chip 31 and substrate 34, and covering the coupling portion between the gold wire 35, and the chip 31 and the substrate 34. The guarding wall 321 may serve as a dike to prevent the filler 36 from overflowing outside the base 32.

f. Ball Attaching

As shown in FIG. 3G, disposing a plurality of metal balls 37 (commonly called as solder balls) on the substrate 34 at a side remote from the chip 31 but not being covered by the filler 37 for coupling with the metallic circuit layer so that electric coupling may be established between the metallic circuit layer and external electrical contacts.

In the process steps set for above (FIGS. 3A–3G), the substrate 34 may be a conventional BGA substrate or a thinner Tape type BGA substrate. The metallic circuit layer may be one or more than one layer. When there is more than one layer, the coupling between the layers may be done by means of plugs (not shown in the figures) running through the substrate. This method is for more complex circuit design and will cost higher. One layer design does not need plugs and costs less but is mainly for simpler package circuits with less pin number (usually less than 100 pins). Nevertheless this invention greatly simplifies production process and lowers cost. Even one layer and small number pin packages such as DRAM, SDRAM produced by means of this method have strong cost competitiveness.

As shown in FIG. 3G, the enhanced heat dissipating chip scale package device produced through the method of this invention has enhanced heat dissipating effect because of the chip 31 is directly adhered to the heat dissipating base 32. It thus has high heat dissipating effect for Enhanced BGA package. As the substrate 34 is smaller size than the chip 31, and the gold wire 35 extends from the chip border inward to the substrate 34, the package size is small and meets CSP requirements. The guarding wall 321 may effectively keep the filler from overflow during molding process. All these advantages enable this invention to produce better enhanced heat dissipating package than those made by conventional BGA package or Enhanced BGA package method.

The following illustrates more embodiments of this invention. Same type of parts will be marked by same numerals except a character affix will be added.

Figure 5:
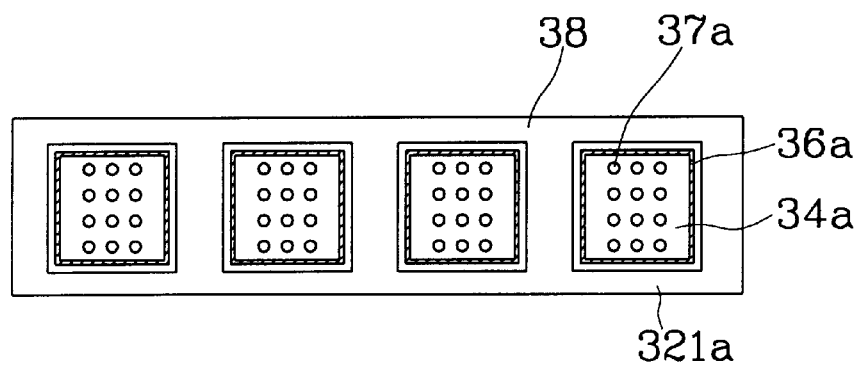
FIG. 5A is a top view of a frame before cutting (after the step 4A, before the step 4H).
FIG. 5B is a finished package unit (i.e., IC device) after the step 4H.
Figure 5:
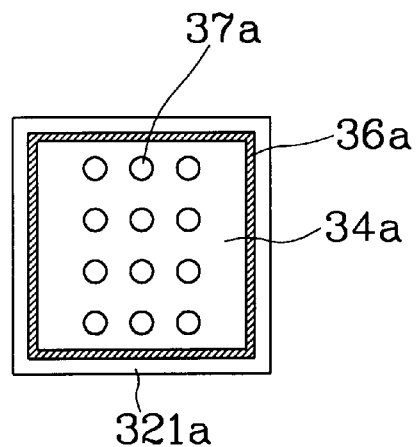

FIGS. 4A through 4H illustrate another embodiment of this invention. It is substantially similar to the one shown in FIGS. 3A to 3G except the steps 4B and 4H. At the step 4B, a plurality of heat dissipating bases 32a are formed in a frame 38. Each of the bases 32a has a guarding wall 321a to form a recess for holding a chip 31a. All other packaging processes are applied to each of the bases 32a in the same manner as shown from FIGS. 3A to 3G until at the step 4H. At the step 4H, all the bases 32a in the frame 38 have completed packaging process. Then the frame 38 is cut to individual package units to become finished IC devices. FIG. 5A illustrates a finished frame 38 before cutting. FIG. 5B illustrates a finished individual package unit after being cut away from the frame 38 shown in FIG. 5A. It is a batch production method which can further increase production efficiency and lower cost.

It may thus be seen that the objects of the present invention set forth wherein, as well as those made apparent from the foregoing description, are efficiency attained. While the preferred embodiments of the invention have been set forth for purpose of disclosure, modifications of the disclosed embodiment of the invention as well as other embodiments thereof may occur to those skilled in the art.

For instance, at the steps 3E and 4E, although the process step "d" uses gold wire bonding for coupling the circuits, other known techniques such as Tape Automated Bonding (TAB) may also be used. In the TAB case, the metallic circuit layer in TAB board has leads extended and engageable with the Al pads of the chip. Then at the step "c" the leads are heated and pressed against the Al pads to establish coupling between the metallic circuit layer and the chip.

Another technique namely Flip Chip BGA package may also be used to substitute the TAB technique. In the Flip Chip BGA package case, a plurality of inner balls are disposed between the metallic circuit layer and the chip for establishing coupling required.

In summary, this invention offers enhanced heat dissipating chip scale package that has small package size, improved heat dissipating capability and may be produced in a simple and low cost manner.

Accordingly, the appended claims are intended to cover all embodiments which do not depart from the spirit and scope of the invention.

What is claimed is:

1. An enhanced heat dissipating chip scale package device, comprising:

a heat dissipating base having a guarding wall bounding a recess therein;

a chip having an integrated circuit layout on a first side surface thereof, the chip being mounted in the recess by means of an adhesive, the first side surface facing outwardly from the recess, the chip further having a plurality of Al pads on the first side surface and disposed around a periphery of and connected to the integrated circuit;

a substrate having at least one metallic circuit layer coupled to the integrated circuit layout of the chip, the substrate being adhered to the first side surface of the chip, the substrate being smaller than the chip such that the Al pads on the chip are not covered by the substrate;

a non-conductive resin located in the recess within the guarding wall and covering only edge portions of the substrate and the chip where said metallic circuit layer of the substrate and integrated circuit layout of the chip are coupled, a surface portion of the substrate facing away from the chip being uncovered by the resin; and, a plurality of metal balls disposed on the uncovered surface portion of the substrate at a side remote from the chip for coupling with the metallic circuit layer of the substrate.

2. The enhanced heat dissipating chip of claim 1, wherein the coupling between the substrate and the chip comprises gold wires.

3. The enhanced heat dissipating chip of claim 1, wherein the substrate comprises a Tape Automated Bonding substrate which has a plurality of leads extending to borders thereof for soldering with the Al pads.

4. The enhanced heat dissipating chip of claim 1, wherein the coupling between the substrate and the chip comprises a Flip Chip Ball Grid Array package technique.

5. The enhanced heat dissipating chip of claim 1, wherein the adhesive comprises an adhesive selected from a group consisting of non-conductive Epoxy and Dual-Sided Adhesive Tape.

6. The enhanced heat dissipating chip of claim 1, wherein the heat dissipating base is made of metal.

7. The enhanced heat dissipating chip of claim 6, wherein the metal comprises a metal selected from the group consisting of gold, copper, silver, aluminum, nickel, and iron and their alloy.

* * * * *